United States Patent [19]

Bellay

[11] Patent Number: 4,527,234

[45] Date of Patent: Jul. 2, 1985

[54] EMULATOR DEVICE INCLUDING A SEMICONDUCTOR SUBSTRATE HAVING THE EMULATED DEVICE EMBODIED IN THE SAME SEMICONDUCTOR SUBSTRATE

[75] Inventor: Jeffrey D. Bellay, Houston, Tex.

[73] Assignee: Texas Instruments Incorporated, Dallas, Tex.

[21] Appl. No.: 404,094

[22] Filed: Aug. 2, 1982

[51] Int. Cl.³ ................... G06F 11/00; G01R 15/12
[52] U.S. Cl. .................................. 364/200; 324/73 R
[58] Field of Search ... 364/200 MS File, 900 MS File; 357/85; 324/158 F, 158 R, 73 R

[56] References Cited

U.S. PATENT DOCUMENTS 4,413,271 11/1983 Gontowski, Jr. et al. ........... 357/85
4,441,154 4/1984 McDonough et al. ............. 364/200

OTHER PUBLICATIONS

*Semiconductor Wafer Testing*–Shultis–IBM TDB, vol. 13, No. 7, Dec. 1970–p. 1793.
*Formation of Kerf Metallurgy on Integrated Semiconductor Circuit Wafers*–Mania et al.,–IBM TDB, vol. 14, No. 9, pp. 2620-2621, Feb. 1972.
*Test Circuit Configuration for Integrated Circuits*–IBM TDB, vol. 14, No. 5, Oct. 1971–Freed, pp. 1598-1599.

*Primary Examiner*—Harvey E. Springborn
*Attorney, Agent, or Firm*—Robert D. Marshal, Jr.; N. Rhys Merrett; Melvin Sharp

[57] ABSTRACT

The present invention is an emulator device for emulation of the functions and operation of a predetermined semiconductor device. A central portion of a semiconductor substrate of the emulator embodies the emulated semiconductor device. This embodiment of the emulated semiconductor device is an exact replica of the emulated device including all input and output connections. The emulator device further includes an additional set of input/output connections located on the periphery of the substrate outside the central portion. These additional input/output connections are connected to portions of the emulated device in the central portion of the substrate. These connections permit additional input signals to be coupled to the emulated device and additional output signals to be received from the device to enable greater control over and monitoring of the emulated device. This periphery preferably also includes further circuits for use in the emulator device for signal conditioning and the like. The preferred embodiment of the emulator further includes an external memory not formed on the same substrate which can be substituted for a similar memory within the emulated device. By this procedure, a program may be tested and debugged prior to embodiment within the emulated device.

8 Claims, 4 Drawing Figures

EMULATOR DEVICE INCLUDING A SEMICONDUCTOR SUBSTRATE HAVING THE EMULATED DEVICE EMBODIED IN THE SAME SEMICONDUCTOR SUBSTRATE

BACKGROUND OF THE INVENTION

1. Field of the Invention

This invention relates to integrated circuit devices and more particularly to emulator systems of complex single chip integrated circuits such as microprocessors or microcomputers.

2. Description of the Prior Art

The fabrication of electronic devices on semiconductor substrates allows for the miniaturization of electronic components. The advantages of such miniaturization not only includes the savings of weight and volume but additionally, miniaturization provides for lower power consumption by the semiconductor electronic devices. As the art of semiconductor manufacturing becomes more mature, the number of electronic devices that are placed on a semiconductor substrate increases. The complexity of semiconductor integration progressed from small integration to medium scale integration and finally to large scale integration. At this time the next step is very large scale integration (VLSI). As the number of electronic devices contained on a single semiconductor substrate increases, the complexity of the functions accomplished by these devices increases. In the early stages of semiconductor integration, a single chip might contain four dual input NAND gates to perform single logic functions. Integrating chips at this level of complexity is relatively simple because by monitoring the inputs and outputs of the chips, the designer is able to tell if the chip was operating properly and further is able to reasonably predict the output for different input states. As circuits contained on the single semiconductor substrate became more complex, monitoring the signals into and out of the chip did not always permit the designer to see exactly what was happening within the electronic devices on the chip.

With the introduction of microprocessors, system testing and system development became fairly complex. Microprocessors not only contain a large number of electronic devices on a single semiconductor chip but also contain electronic devices that are programmable. This allows the designer to program the semiconductor device in order to perform certain desired functions. With this capability, however, the designer also needs the capability to monitor the internal performance of individual electronic devices contained on the semiconductor chip in order to determine if the program that is in the microprocessor or microprocomputer will accomplish its intended function. Recently, microprocessor and microcomputer development systems have been marketed to perform this function. These development systems supply the designer with what seems to be the microprocessor or microcomputer that is contained on a semiconductor chip. In actuality, the microprocessor or microcomputer is being emulated by a set of individual semiconductor devices of a smaller complexity tied together in such a manner as to emulate at least a portion of the operations of the microprocessor or microcomputer. In addition to the emulation capability, the development system also provides the user with the ability to view data that is contained internally in the microprocessor together with certain control functions to allow the user or designer to control the operation of certain portions of the microprocessor or microcomputer in order that they may observe the operation of the microprocessor or microcomputer while executing different user defined programs. In this manner, the designer may determine the behavior of the microprocessor or microcomputer when executing a designer's specified program. Therefore the designer uses the development system to develop software to be installed or fabricated in the microprocessor or microcomputer so that the microprocessor or microcomputer will then function as the designer desires.

Several development systems are currently available for developing software for a variety of microprocessors and microcomputers. All of these development system, however, suffer from the same disadvantage; they do not actually contain the microprocessor or microcomputer in its final form that is emulated. They merely simulate the hardware of these devices. This may result in problems when the software developed is later fabricated in the actual chip. These problems may arise from differences in timing or signal characteristics between the devices of the emulator and the internal devices on the chip.

This invention employs interconnection techniques that have existed in semiconductor technology. U.S. Pat. No. 3,577,038 entitled "Semiconductor Devices" by Charles R. Cook assigned to Texas Instruments Incorporated includes the description of the interconnection of semiconductor devices on the semiconductor substrate. Another source of teaching is U.S. Pat. No. 3,643,232 entitled, "Large Scale Integration of Electronic Systems and Microminiature Form" by Jack S. Kilby, filed Dec. 21, 1964, assigned to Texas Instruments Incorporated.

SUMMARY

In accordance with the present invention, an electronic system is disclosed including a semiconductor substrate, a plurality of selectively interconnected electronic devices located on the semiconductor substrate. A first set of external interconnection pads are located on the semiconductor substrate and are selectively interconnected to the electronic devices. A second set of interconnection pads are selectively interconnected to the electronic devices and are peripherally located on said semiconductor substrate.

In the preferred embodiment, the second set of external interconnection pads are located on a peripheral perimeter than surrounds the first set of interconnection bonding pads. This physical structure allows for the fabrication of the semiconductor device by omitting the second set of interconnection pads without altering the electronic devices contained on the semiconductor substrate or altering the first set of interconnection pads.

In another embodiment, an electronic development system is disclosed that includes input circuitry for providing user inputs to the electronic semiconductor device under development. Also included are output circuits to provide output information from the electronic semiconductor device. The electronic semiconductor device includes a plurality of electronic devices formed on the semiconductor surface interconnected to a first set of bonding pads to provide external interconnections to the input and output circuitries. A second set of bonding pads is peripherally located on the semiconductor device to provide additional interconnections between the input and output circuitries and the electronic devices located on the semiconductor substrate. This configuration allows the user to monitor the input and output signals to the semiconductor device under test and further allows the user to control and monitor the internal states of the electronic devices on the semiconductor substrate.

In an alternate embodiment, control circuitry is also provided in the electronic development system to allow the user to control the states of the electronic devices located on the semiconductor substrate. In this manner the user is provided with the capability to test the electronic semiconductor device under development in several conditions by varying the input and observing the output and by controlling the states of the internal electronic devices during varied input conditions.

A further embodiment of this invention provides additional circuits contained on the substrate adjacent to the second set of bonding pads. This additional circuitry may include control and monitoring circuitry to aid in system development. This additional circuitry may also be omitted with the second set of bonding pads without altering the electronic devices on the substrate or the first set of bonding pads.

It is an object of this invention to provide an integrated circuit chip that can emulate a second integrated circuit chip containing several electronic devices interconnected to accomplish at least one electronic function.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with accompanying drawings, wherein:

DESCRIPTION OF THE PREFERRED EMBODIMENT

Figure 1:
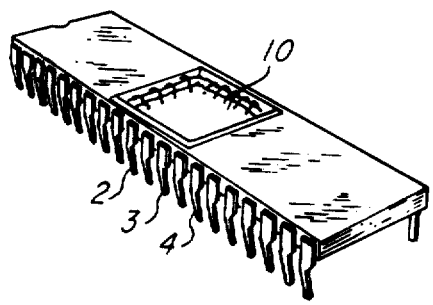
FIG. 1 is an illustration of a prior art chip mounted in a chip carrier.

This invention relates to the physical layout of a complex integrated circuit. FIG. 1 illustrates a chip 10 mounted upon a dual in-line package chip carrier. Each of the pins such as 2, 3 and 4 are connected by a bonding wire to the chip 10. In this manner, signals external to the chip 10 are interfaced to the chip 10. The chip 10 is actually an integrated circuit contained on a semiconductor substrate and contains several electronic devices which perform some electronic functions. The complexity of the electronic function determines to some respect the number of signals required to interface to the chip. In FIG. 1 the circuitry contains a high number of pins, such as 2, 3 and 4 that are required to be interfaced to chip 10. This arrangement provides a convenient package to protect chip 10 and allows for the easy interconnection of the chip to an external circuit using a dual in-line package socket; or the package can be placed onto a printed circuit and the pins, such as 2, 3 and 4 soldered on the conductive surfaces of the printed circuit board.

Figure 2:
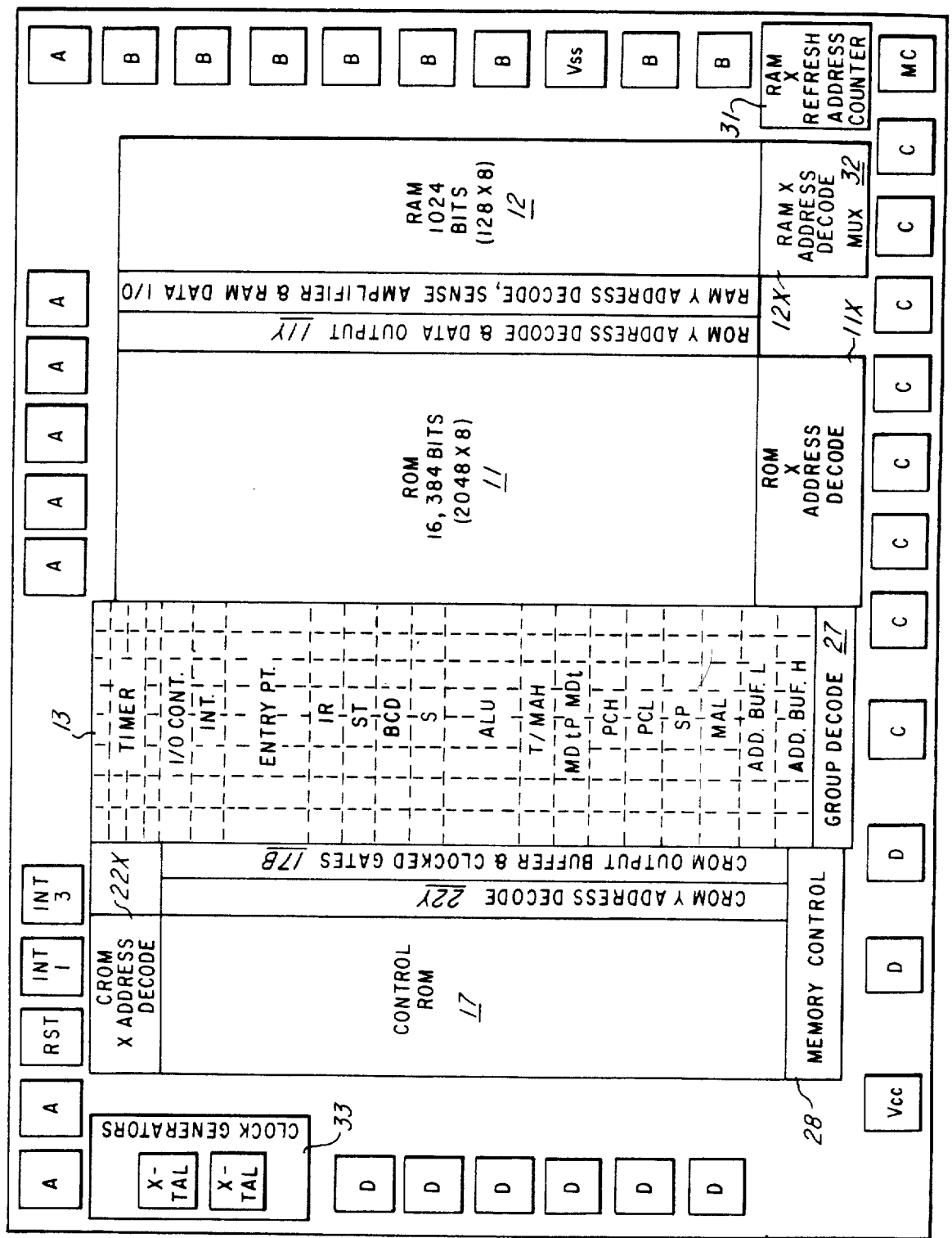
FIG. 2 is a top level view of a typical prior art semiconductor chip layout.

An example of a typical prior art complex chip layout is shown in FIG. 2. A chip 10 consists of several bonding pads located around the peripheral border of the chip device and labeled A, B, C, D, MC INT1, INT3, RTS, X-TAL, Vss, Vcc and MC. This chip layout is the layout that is disclosed in U.S. Pat. No. 4,441,154 herein incorporated by reference and illustrates the chip layout of a microcomputer. The bonding pads marked A, B, C and D serve as input ports or output ports as described in the previously mentioned patent application. The bonding pads marked X-TAL are pads to interface to clock generators. Vss and Vcc are voltage supply pads required to supply voltage to the microcomputer. RST is the pad for the signal to reset the microcomputer. INT1 and INT3 are interrupt pads to receive interrupt signals from an external device. MC is a pad to receive a mode control signal. All these pads are connected by a bonding wire to their respective external pins such as shown in FIG. 1 or to a flat pack connection not shown. All complex circuitry contained on the chip 10 is connected to the pads by layers of conductive material in the chip 10 itself. These interior layers of the chip are not shown. Fabrication of such connections is illustrated in U.S. Pat. No. 3,577,038 entitled "Semiconductor Devices" by Charles R. Cook and U.S. Pat. No. 3,643,232 entitled "Large Scale Integration of Electronic Systems in Microminiature Form" by Jack S. Kilby herein incorporated by reference. The circuitry on chip 10 in FIG. 2 includes a read-only memory (ROM) 11 that contains 2K (2048×8 bits) of instructions for the microprocessor. This ROM is addressed by the ROM address decode and data output circuity 11y and ROM X address decode circuitry 11X. Adjacent to ROM 11 is random access memory (RAM) 12 of 1K (128×8 bits) which is connected to the RAM X address code circuitry 12X and RAM Y address code sense amplifiers and RAM data I/O circuitry.

The RAM 12 acts as a scratch pad memory for the temporary storage of data. Instructions in ROM 11 are decoded and processed through the control ROM 17 to produce control signals for the microcomputer components contained on the strip 13. Included on the strip 13 are a timer (TIMER), an input/output controller (I/O CONT), interrupt circuitry (INT), an instruction register (IR), a status register (ST), an arithmetic logic unit (ALU), address buffers (ADD BUF L and ADD BUF H) and various data and address registers. In the normal operation of the microcomputer, the ROM 11 is fabricated with a series of instructions and/or data that define operations on data that may be obtained externally or exists either in the ROM 11 or RAM 12. The instructions in ROM 11 are decoded by the control ROM 17 to produce the control signals to cause the devices in strip 13 to perform the prescribed operations on data. In the performance of these operations, data from the input terminals are inputted to the microcomputer and outputs are placed on the output ports to be sent to external devices.

In the normal operation of the microcomputer shown as chip 10 all the input and output information together with power signals are provided to the bonding pads shown. Therefore, after the program has been fabricated in ROM 11, then the user may simply plug in the chip and chip carrier as shown in FIG. 1 into the circuit and turn the total system on, and the microcomputer contained on chip 10 will function properly. Before the final program can be fabricated in ROM 11, however, this program must be debugged. In addition to debugging the program, external signals to be inputted to the microcomputer on chip 10 must be properly interfaced to the chip. Likewise output signals from the microcomputer on chip 10 must be properly interfaced to their respective external devices receiving these outputs.

It is often helpful to the designer who is devloping software or interfacing the microcomputer to external devices, to be able to determine what is happening in the devices contained internally in the microcomputer. For example, it is often helpful to monitor the information that flows on the data buses and to observe the addresses being accessed. Monitoring the interrupts and circuits that transmit the outputs and receives the inputs signals can often aid in interfacing the chip to external devices. In the program debugging phase, often monitoring instruction acquisition and the resulting microcode addresses is also helpful. Other microcomputer devices such as the timer and the arithmetic logic unit are prime candidates for observation. In addition to monitoring these different devices contained on chip 10, it is often helpful to be able to control the operation of the chip by some external device. One example is the use of a single step capability to single step the execution instructions in the microcomputer and observe the result of each instruction. In this manner, the system developer may observe and control the actual execution of the program in the microcomputer. Another example of control is a breakpoint feature which enables the system developer to stop or halt the computer operation at a certain point in the program or when the microcomputer produces a certain output pattern.

The ability to monitor and control the microcomputer is not available on a chip such as illustrated in FIG. 2. As discussed previously, this ability is made available to system developers in system emulators. The system emulators are constructed from several integrated circuits to emulate the operation of the single chip microcomputer. These emulators are to perform at least partially as the original or emulated microcomputer chip but often consist of several boards in a computer based system. In addition to the above described features that aids system development, system emulators normally allow the system developer to specify the contents of the program counter, the instruction register, load and read the information stored in the RAM and generally determine at any point the state of operation of the microcomputer.

There are certain disadvantages when depending on emulators for system development. Emulators require additional design efforts that often prove to be expensive and time-consuming. The emulator is always much more expensive to purchase than the individual semiconductor device emulated, although the emulator offers many features not offered on the semiconductor device. Another problem is that the design and fabrication of the emulator often occurs after the initial semiconductor device has been introduced on the market. This prevents the system designer from developing a system for early introduction of the product developed on a system emulator. Most of the problems with the use of emulators, however, center around the differences between the emulator and the semiconductor circuit emulated. By design, the emulated circuitry and the semiconductor circuitry should be as consistant as possible. Since the emulator provides many features not found in a semiconductor device and since the emulator is fabricated differently than the semiconductor device, many differences still do exist. It is these differences that introduce problems in the development of systems for the semiconductor device. One such problem is caused by the differences in the timing between the circuitry internal to the semiconductor device and the circuitry contained in the emulator. While these internal timing differences may be small, they may be enough to generate problems when the system designer attempts to interface the semiconductor device loaded with the development program into a system. In other words, the software and system interface developed on the emulator may not function in the similar manner in the semiconductor device itself. These timing differences can exist for internal components in a micromprocessor or microcomputer together with timing differences in the input or output circuitry. For the microprocessor or microcomputer external interface (input/output) this difference can be crucial. In a synchronous input/output circuit any timing differences between the emulator circuitry and the actual microprocessor fabricated in the semiconductor device can cause interfacing problems. Even in asynchronous input/output circuit, a difference in timing between the emulator circuitry and the actual microprocessor on the semiconductor device may result in interface problems. Differences in signal characteristics between the input and output of the system emulator and the input and the output of the microprocessor on the semiconductor device can be another source of interface problems. In summary, any hardware or software difference between the emulator and the actual chip will prevent a thorough checkout of the system using the emulator. To be useful, the emulator design should be as consistent as possible with the actual chip configuration.

Figure 3:
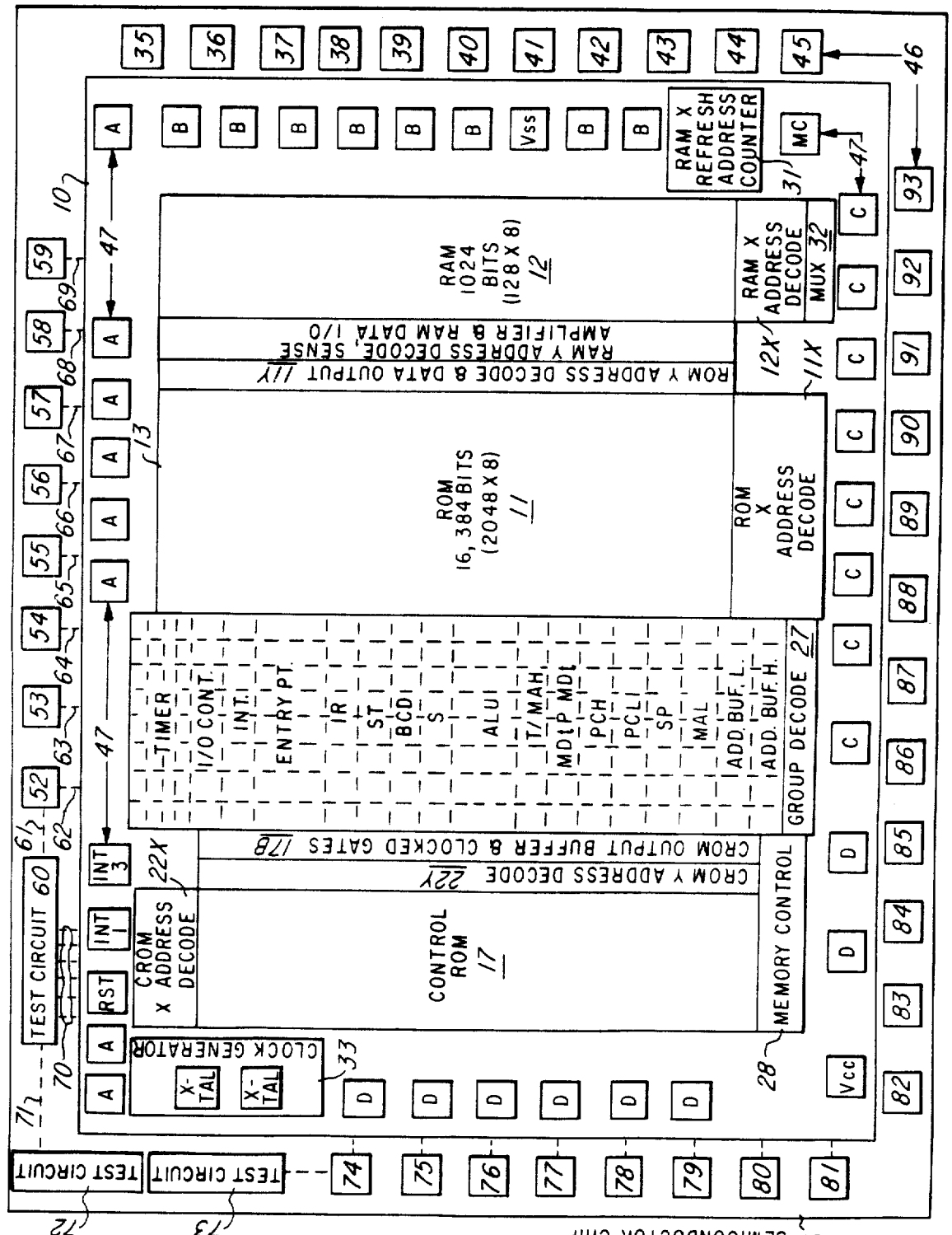
FIG. 3 is a top view of the layout of a semiconductor chip employing the peripheral bonding pads.

This invention presents a solution to the above problems. The invention illustrated in FIG. 3 includes an actual microcomputer device implemented on a chip 10 contained on another semiconductor chip 51. The additional silicon area on chip 51 surrounds the microcomputer circuitry in area 10. The layout of area 10 is identical to the layout of chip 10 in FIG. 2. This includes a peripheral set of bonding pads 47 that provide power, interrupt, reset, mode control and input and output signals as previously discussed. Additionally, a peripheral band 46 is provided that includes both bonding pads 52 through 59, 35 through 45, 74 through 93 and test circuitry 60, 72 and 73. Bonding pads 52 through 59 are connected to the internal microcomputer circuitry in area 10 via lines 62 through 69 as shown. These lines represent conductive interfaces that may be physically underneath the top layer or layers of the semiconductor material on substrate 51. These interconnections 62 through 69 are fabricated at the same time that the devices in the microcomputer in chip 10 are fabricated. In addition, the bonding pads of the peripheral band 46 are preferrably connected to the test circuitry 60, 72 and 73. Bonding pad 52 is shown connected to test circuitry 60 via line 61. Test circuitry 60 is also shown interconnected to the internal portions of the microcomputer on chip 10 by lines 70. Additionally test circuitry 60 is connected to test circuitry 72 by line 71. This illustration is merely an example of possible interconnections between the bonding pads in perimeter 46, the test devices 60, 72 and 73 along the same perimeter and the internal structure of the microcomputer. The bonding pads on the peripheral band 46 provide both input and output information to external circuitry to provide the system designer with points of observation and control not available on the bonding pad perimeter 47. The electrical circuits 60, 72 and 73 provide on-chip circuitry to perform emulation functions, such as control of the internal states of the microcomputer in chip 10. Therefore the system designer can use the outer peripheral perimeter of bonding pads and circuits on the peripheral bond 46 to provide control inputs or data inputs into the microcomputer in chip 10 and also use these same bonding pads and test circuitry for monitoring and observations of critical points in the microcomputer.

The advantage of the structure of this invention is that the chip that is being emulated, i.e., the circuitry in area 10, is actually contained within the semiconductor device 51 in its final fabricated form. While this provides an increase assurance of identical functionality between the emulator and the microcomputer itself, another advantage is that the fabrication of the emulator may occur at the same time as the fabrication of the semiconductor microcomputer chip itself. During the design of the microcomputer, the emulator peripheral, such as the peripheral band 46, will also be designed allowing the microcomputer design engineers to design a test bar that allows them to observe the internal interactions in the semiconductor chip. This aids the microcomputer designers in debugging the hardware design and layout of the microcomputer itself. When the internal structure of chip 10 has been debugged, then the mask producing the microcomputer chip is altered to eliminate the peripheral band 46 containing the emulator, bonding pads and test circuitry. However, at the same time this chip is introduced the manufacturer may also sell emulators containing the extra peripheral band 46 to be used by system developers to develop software and interface circuitry for their system designs.

It should be obvious to one skilled in the art that additional peripheral bands may be added that address additional functionality requirements of the emulator. In other words, an additional band may be added that will aid the microcomputer designers in debugging the microcomputer. This band will be eliminated from the emulator chip sold to system designers if it contained features not required by the system designers. This removal would be the same as the removal of a emulator band shown in FIG. 3, i.e., by omission of the perimeter from the mask in the production of the semiconductor devices. The elimination of the peripheral band from the mask in the production of the semiconductor devices does not present a problem in the fabrication of the chip since the additional areas used for the emulation and bonding pads circuitries are simply not produced. The chip size becomes smaller in fabrication.

Figure 4:
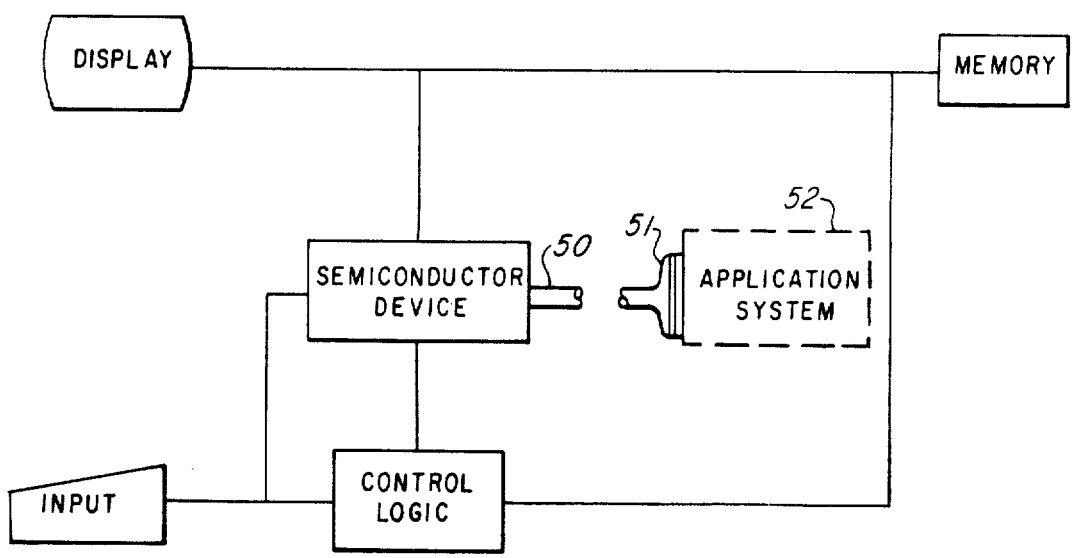
FIG. 4 is a block diagram of a development system employing the semiconductor device with the peripheral bonding pads.

A total emulation system using the invention is illustrated in FIG. 4. This system includes user input circuitry. The emulator system output is provided to be user on the display. The key elements of this emulation system, however, are the control logic 94, memory 95 and the semiconductor device 96 itself. The control logic 94 includes circuitry to provide the user with internal control over the emulated circuit and provide means for the orderly observation of critical points on the circuit. Using microcomputer shown in FIG. 3, the control logic 94 interfaces to both the bonding pads 47 and emulator bonding pads and test circuitry on peripheral band 46. The memory 95 contained in the emulator system is dual purpose. The first purpose is that it serves as a storage area for data obtained from the semiconductor device itself during test. The second purpose is that it stores test programs that may be executed in the control logic 94 to conduct test of the semiconductor device. The results of these tests and outputs from the semiconductor device 96 of the test are shown to the user on the display 97. The memory 95 may also contain the user generated software to be executed by the semiconductor device 96 under test. This memory will allow the user to debug the device software without fabricating a ROM for each software version. In addition the device may be connected to the application system 52 by a cable 50 and pin connector 51. The pin connector 51 resembles the actual pin connection for the production version of the semiconductor device (i.e., the device without the emulator peripheral band). With this emulation system the user can program the control logic via the memory to conduct test of the semiconductor device, control the performance of these tests and observe the results of these tests.

It should be obvious to one skilled in the art that while this invention is illustrated for use in microcomputers, the total scope of the invention includes all semiconductor devices that may require additional interconnections to aid in development of the semiconductor device itself or systems using the semiconductor device.

I claim:

1. A circuit emulator device for emulation of the function and operation of a predetermined electronic device embodied in a semiconductor substrate, said circuit emulator device comprising:
   a semiconductor substrate (51);
   said predetermined electronic device (10) embodied in a central area of said semiconductor substrate, said predetermined electronic device having a plurality of electronic circuits (11, 11x, 12, 12x, 13, 17, 22x, 27, 28, 31, 32, 33), said predetermined electronic device having a first set of external interconnection means (A, B, C, D, RST, INT 1, INT 3, XAL, $V_{ss}$, MC, and $V_{cc}$) located at the periphery (47) of said central area connected to some of said plurality of electronic circuits for external connection of input, output and control signals to said predetermined electronic device;
   a second set of external interconnection means (35-45, 52-59, 74-93) located at the periphery (46) of said semiconductor substrate outside said central area connected to other of said plurality of electronic circuits than said first set of external interconnection means for additional external connection of input, output and control signals to said predetermined electronic device, whereby the function and operation of said predetermined electronic device can be controlled via said additional input and control signals and observed via said additional output signals.

2. A circuit emulator device as claimed in claim 1, further comprising:
   at least one test electronic circuit (60, 72, 73) disposed on the periphery of said semiconductor substrate and connected to said second set of external interconnection means for performing functions upon said additional input signals.

3. A circuit emulator device as claimed in claim 1, further comprising:
   at least one test electronic circuit (60, 72, 73) disposed on the periphery of said semiconductor substrate and connected to said second set of external interconnection means for preforming functions upon said additional output signals.

4. A circuit emulator device as claimed in claim 1, further comprising:

at least one test electronic circuit (60, 72, 73) disposed on the periphery of said semiconductor substrate and connected to said second set of external interconnection means for preforming functions upon said additional control signals.

5. A circuit emulator device as claimed in claim 1, wherein:

said plurality of electronic circuits of said predetermined electronic device includes a digital processing means (ALU) and a read only memory (11) for storing therein a program consisting of a plurality of instructions for control of the function and operation of said predetermined electronic device via said digital processing means performing said program;

said circuit emulator device further comprises an external memory (95) not formed on said semiconductor substrate having stored therein an external program consisting of a plurality of instructions; and said second set of external interconnection means being connected to said external memory means and including means for substituting said external memory for said read only memory, whereby said function and operation of said predetermined electronic device is controlled by said external program stored in said external memory means via said digital processing means performing said external program.

6. A circuit emulator device as claimed in claim 5, wherein:

said second set of external interconnection means is so connected to said other electronic circuits whereby a single step additional input signal causes said digital processing means to perform a program a single instruction at a time.

7. A circuit emulator device as claimed in claim 5, wherein:

said second set of external interconnection means is so connected to said other electronic circuits whereby a breakpoint additional input signal causes said digital processing means to stop performance of a program upon reaching a predetermined instruction of said program.

8. A circuit emulator device as claimed in claim 5, wherein:

said second set of external interconnection means is so connected to said other electronic circuits whereby a halt additional input signal causes said digital processing means to stop performance of a program when said predetermined electronic device reachs a predetermined internal state.

* * * * *